United States Patent
Hsiao et al.

(10) Patent No.: US 7,859,900 B2
(45) Date of Patent: Dec. 28, 2010

(54) BUILT-IN SELF-REPAIR METHOD FOR NAND FLASH MEMORY AND SYSTEM THEREOF

(75) Inventors: Yu Ying Hsiao, Hsinchu (TW); Cheng Wen Wu, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 176 days.

(21) Appl. No.: 12/194,111

(22) Filed: Aug. 19, 2008

(65) Prior Publication Data

US 2009/0161431 A1    Jun. 25, 2009

(30) Foreign Application Priority Data

Dec. 21, 2007    (TW) .............................. 96149151 A

(51) Int. Cl.
*G11C 16/06*    (2006.01)
(52) U.S. Cl. .................. 365/185.09; 365/200; 365/201; 365/49.1
(58) Field of Classification Search ............ 365/189.09, 365/200, 185.09, 201, 49.1
See application file for complete search history.

(56) References Cited

U.S. PATENT DOCUMENTS

| | | | |
|---|---|---|---|
| 6,546,503 B2 * | 4/2003 | Ooishi ............................ | 714/7 |
| 7,352,638 B2 * | 4/2008 | Suitou et al. ................. | 365/200 |
| 7,366,965 B2 * | 4/2008 | Yamasaki et al. ........... | 714/718 |
| 7,508,725 B2 * | 3/2009 | Sugiura et al. .............. | 365/201 |

OTHER PUBLICATIONS

C. T. Huang, C. F. Wu, J. F. Li, and C. W. Wu, "Built-In Redundancy Analysis for Memory Yield Improvement", IEEE Transaction on Reliability, vol. 52, No. 4, pp. 386-399, Dec. 2003.
M. Lee, L. M. Denq, and C. W. Wu, "Brains+: A Memory Built-in Self-Repair Generator", pp. 1-5.
Y. Y. Hsiao, C. H. Chen, and C. W. Wu, "A Built-In Self-Repair Scheme for NOR-Type Flash Memory", IEEE VLSI Test Symposium (VTS'06), 2006.
Y. Y. Hsiao, and C. W. Wu, "A Built-In Self-Repair Scheme for NAND Flash Memory".

* cited by examiner

*Primary Examiner*—Pho M Luu
(74) *Attorney, Agent, or Firm*—WPAT, P.C.; Anthony King

(57) ABSTRACT

A built-in self-test system applied to NAND flash memory comprises a built-in self-test circuit, a built-in redundancy-analysis circuit, a content addressable memory, a spare memory, a page-mode processor and an address generator. The built-in self-test circuit is configured to test for defective data in a NAND flash memory. The built-in redundancy-analysis circuit is connected to the built-in self-test circuit. The content addressable memory is connected to the built-in redundancy-analysis circuit for storing the address of the defective data. The spare memory is electrically connected to the content addressable memory. The page-mode processor is configured to generate a page address signal and a compensation signal according to an address signal of the NAND flash memory. The address generator is configured to generate a current address signal according to the page address signal and compensation signal to the content addressable memory.

19 Claims, 6 Drawing Sheets general format:

| category of spare memory | spare memory identification | block address | NAND block address | column address | defective address | validity |
|---|---|---|---|---|---|---| spare column format:

| 0 | spare memory identification | block address | reserved | column address | defective address | validity |
|---|---|---|---|---|---|---| spare NAND block format:

| 1 | spare memory identification | block address | NOR block address | reserved | reserved | validity |
|---|---|---|---|---|---|---|

FIG. 5

BUILT-IN SELF-REPAIR METHOD FOR NAND FLASH MEMORY AND SYSTEM THEREOF

BACKGROUND OF THE INVENTION

1. Field of the Invention

The present invention relates to a built-in self-repair (BISR) method and system applied to a memory, and more particularly, to a BISR method and system applied to a NAND flash memory.

2. Description of the Related Art

The flash memory is the most important non-volatile memory on the market, and is characterized by short access time and superior vibration-proof capability. Generally, the flash memory can be of either NOR or NAND type. Although the NOR-type flash memory exhibits a drawback of a longer programming and erasing time, it nonetheless possesses an advantage of random access so that many computer systems need not update frequently. Computer components such as BIOS and firmware are suitable for use with NOR-type flash memories. In contrast, the NAND-type flash memory has the advantages of faster programming and erasing time, longer lifetime and low cost, but only allows consecutive read operations in its I/O ports. Therefore it is primarily used in mobile storage devices, such as personal digital assistants (PDA) and cellular phones.

Generally, commercial flash memories verify their accuracy through probe and tester machines. However, due to an increasing need for system on chip (SOC) and embedded systems, general probes and tester machines face a bottleneck to test such devices. In addition, the yield of a single chip relies primarily on the yield of the flash memory. Therefore it is necessary to design a built-in self-test or self-repair system.

The BISR system for a NOR flash memory primarily includes a built-in self-test (BIST) circuit, a built-in redundancy-analysis (BIRA) circuit and an address replacement module. The BIST circuit uses an algorithm to test for defective data of a flash memory, and provides test data to the BIRA circuit. The BIRA circuit uses the test data and an algorithm to establish a repair strategy. The address replacement module replaces defective data in accordance with the repair strategy using spare storage of the flash memory to complete a self-repair operation.

NAND flash memory reads and writes in a page-unit basis, and erases in a block-unit basis; therefore its BIRA system is different from that of a NOR flash memory and accordingly needs a special design. Traditionally, the BISR system for prior NAND flash memories uses spare columns to repair. However, if defective data are distributed over an entire page, it will cost dozens of spare columns to conduct the repair and is accordingly very inefficient.

SUMMARY OF THE INVENTION

The present invention proposes a built-in self-test system applied to NAND flash memories, comprising a built-in self-test circuit, a built-in redundancy-analysis circuit, a content addressable memory, a spare memory, a page-mode processor and an address generator. The built-in self-test circuit is configured to test for defective data in a NAND flash memory. The built-in redundancy-analysis circuit is connected to the built-in self-test circuit. The content addressable memory is connected to the built-in redundancy-analysis circuit for storing the address of the defective data. The spare memory is electrically connected to the content addressable memory. The page-mode processor is configured to generate a page address signal and a compensation signal according to an address signal of the NAND flash memory. The address generator is configured to generate a current address signal according to the page address signal and compensation signal to the content addressable memory.

The present invention proposes a built-in self-test method applied to NAND flash memories, comprising the steps of: testing a NAND flash memory; marking a defective column if more than one defective data record is found in the defective column; marking a defective NAND block if more than one defective data record is found in the defective NAND block; repairing the defective column with a spare column; and repairing the defective NAND block with a spare NAND block.

The present invention proposes a built-in self-test method applied to NAND flash memories, comprising the steps of: testing a NAND flash memory; collecting defective data after the test; repairing the defective data with spare columns; and repairing the defective data with spare NAND blocks.

BRIEF DESCRIPTION OF THE DRAWINGS

The invention will be described according to the appended drawings in which:

FIG. 5 shows the format of defective data stored in the CAM after the self-repair procedure ends.

PREFERRED EMBODIMENT OF THE PRESENT INVENTION

Figure 1:
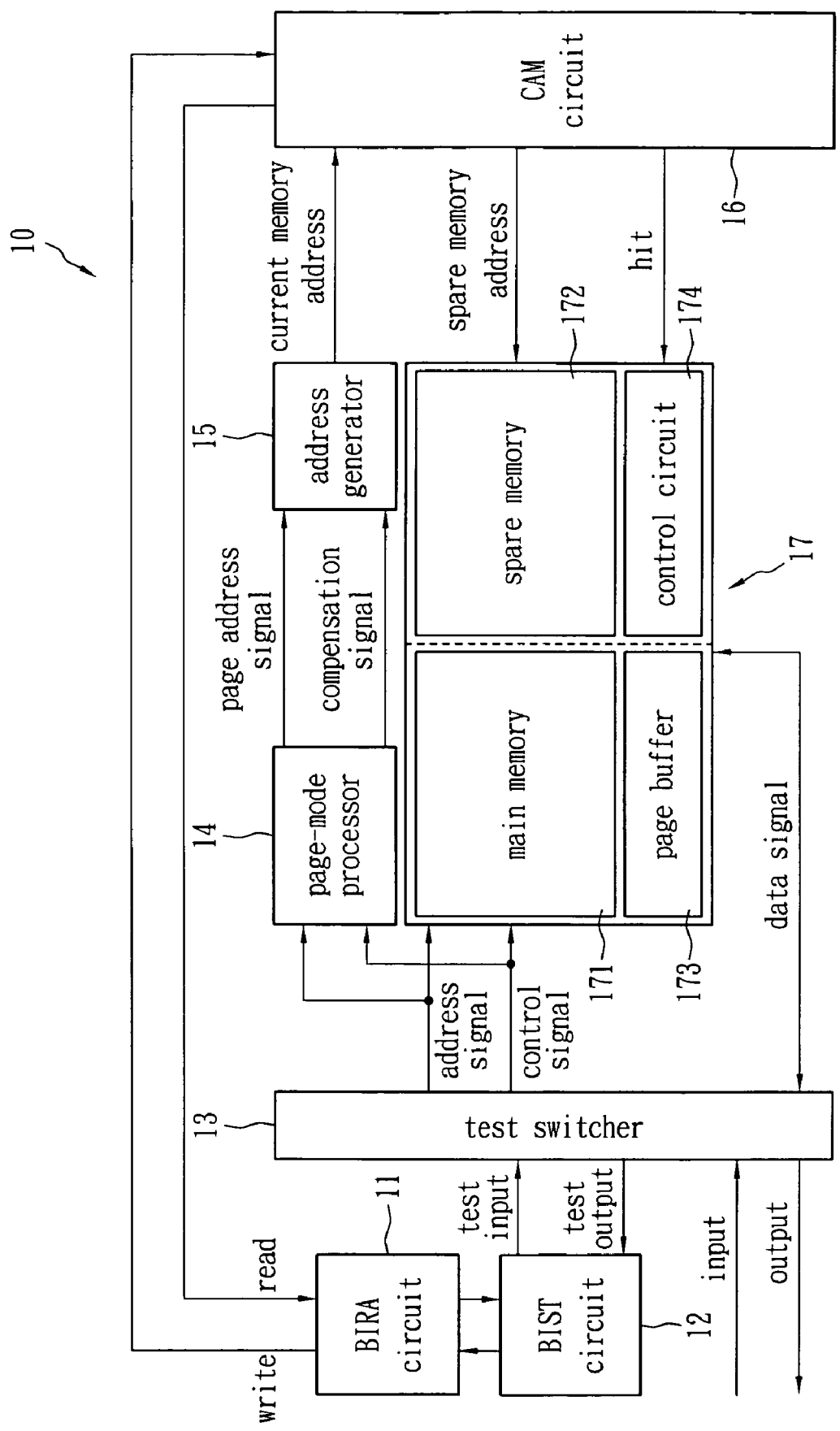
FIG. 1 shows a built-in self-repair system applied to a NAND flash memory according to one embodiment of the present invention.

FIG. 1 shows a built-in self-repair system 10 applied to a NAND flash memory according to one embodiment of the present invention. The system 10 includes a BIRA circuit 11, a BIST circuit 12, a test switcher 13, a page-mode processor 14, an address generator 15, a content addressable memory (CAM) 16 and a memory module 17, where the memory module 17 includes a main memory 171, a spare memory 172, a page-mode buffer 173 and a control circuit 174. The test switcher 13 is employed to switch between a test mode and a normal mode, which corresponds to the input/output of the memory module 17 and page-mode processor 14. In the test mode, the BIST circuit 12 uses an algorithm to test and search for defective data in the main memory 171, and transfers the information thereof to the BIRA circuit 11. The CAM 16 may be a flash memory, which is used to store the information of the defective data of the main memory 171. The BIRA circuit 11 is capable of accessing the content of the CAM 16 and replaces the defective data of the main memory 171 with the spare memory 172. In the normal mode, the self-repair procedure has been completed, and the content of the defective data has been stored in the CAM 16. The system 10 searches the content of the CAM 16 first. If defects are found, then the system 10 will access the spare memory 172. Otherwise, it will access the main memory 171. The control circuit 174 is employed to control the read, write and erase actions for the memory module 17. The page-mode buffer 173 is employed to provide a buffer for accessing burst data during read and write periods.

Normally, a NAND flash memory includes many blocks, and each can further be divided into multiple sub-blocks, called NAND blocks. A NAND block includes two-line transistors and eight-row or sixteen-row flash units. When a page (or row) of a NAND flash is being accessed, the page and a transistor corresponding to the bit line have to be activated. In other words, from the view of rows, a NAND block is deemed as a most basic element of the NAND flash memory.

NAND flash operates read and write operations in a burst mode manner. If the read or write operation includes defective data, an erroneous result occurs because the memory module 17 fails to find the presence of the defective unit. Therefore, the present invention provides a page-mode processor 14 and an address generator 15. The page-mode processor 14 determines the current operating instructions in accordance with input control signals. If the instruction is for read or write operations, a page address signal and a compensation signal are outputted to the address generator 15 in accordance with its starting address. The address generator 15 generates a current address signal to the CAM 16 and the memory module 17 in accordance with the received page address signal and the compensation signal. The page-mode processor 14 and the address generator 15 synchronously provide the current address signal. If the current address is recorded in the CAM 16, it indicates the current address signal corresponds to a defective data record and thus the CAM 16 will output a hit signal to the memory module 17 so that the corresponding elements of the spare memory 172 are in place of the defective data of the main memory 171. During the operation of an erase instruction, because the system of the present invention is built on a NAND block basis, the data of the main memory 171 and the spare memory 172 can be erased synchronously without causing errors. Meanwhile, the page-mode processor 14 is inactive.

Figure 2:
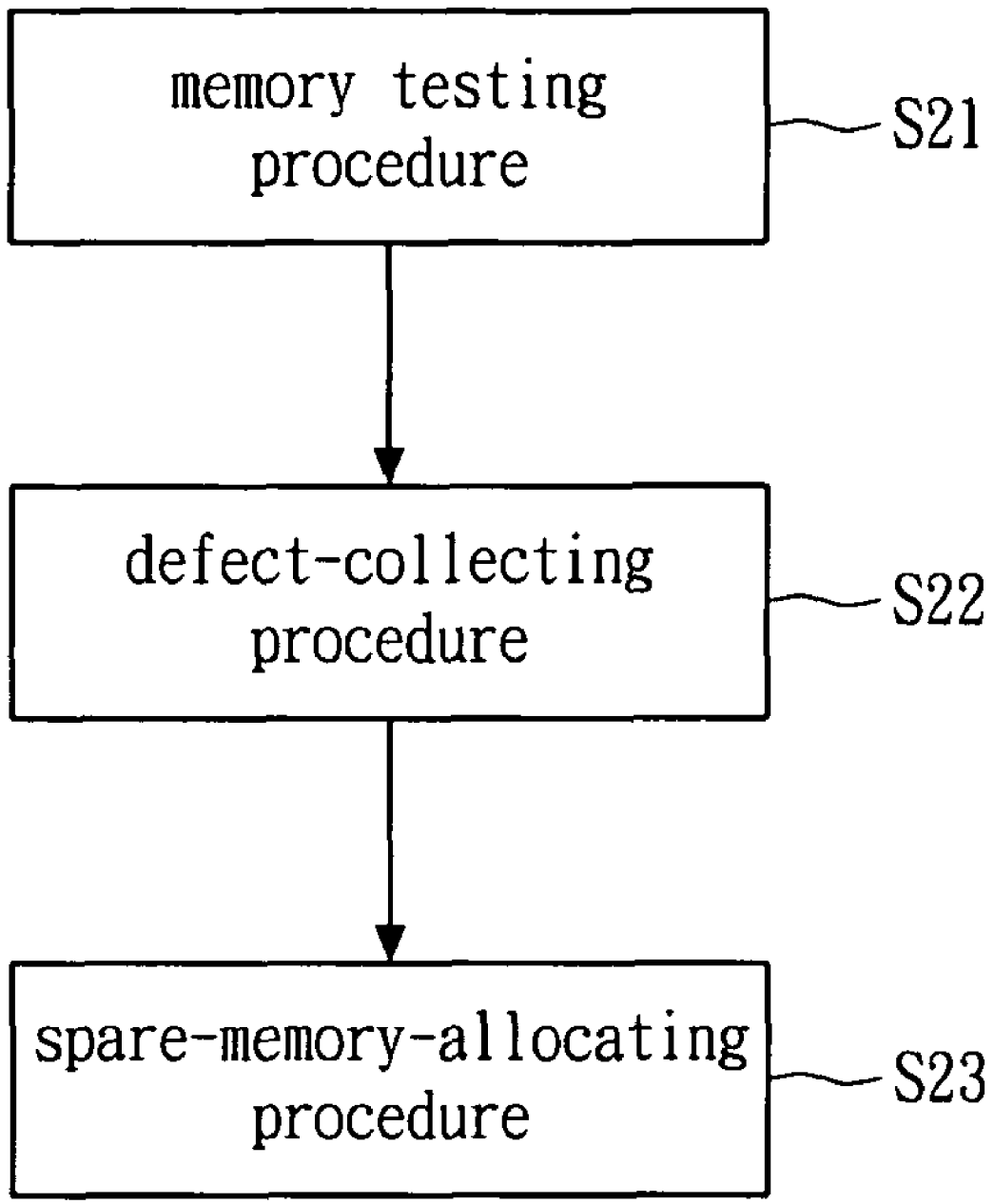
FIG. 2 shows a flow chart of a built-in self-repair method for NAND flash memory in accordance with an embodiment of the present invention.

FIG. 2 shows a flow chart of the built-in self-repair method for NAND flash memory in accordance with an embodiment of the present invention. In step S21, a memory-testing procedure is performed by using the BIST circuit 12 to test a NAND flash and later to provide defective data to the BIRA circuit 11. In step S22, a defect-collecting procedure is performed by using the BIRA circuit to collect the defective information of the BIST circuit 12. In step S23, a spare memory allocating procedure is performed by using the BIRA circuit 11 to allocate the spare memory in accordance with the information of the defect-collecting procedure.

Figure 3:
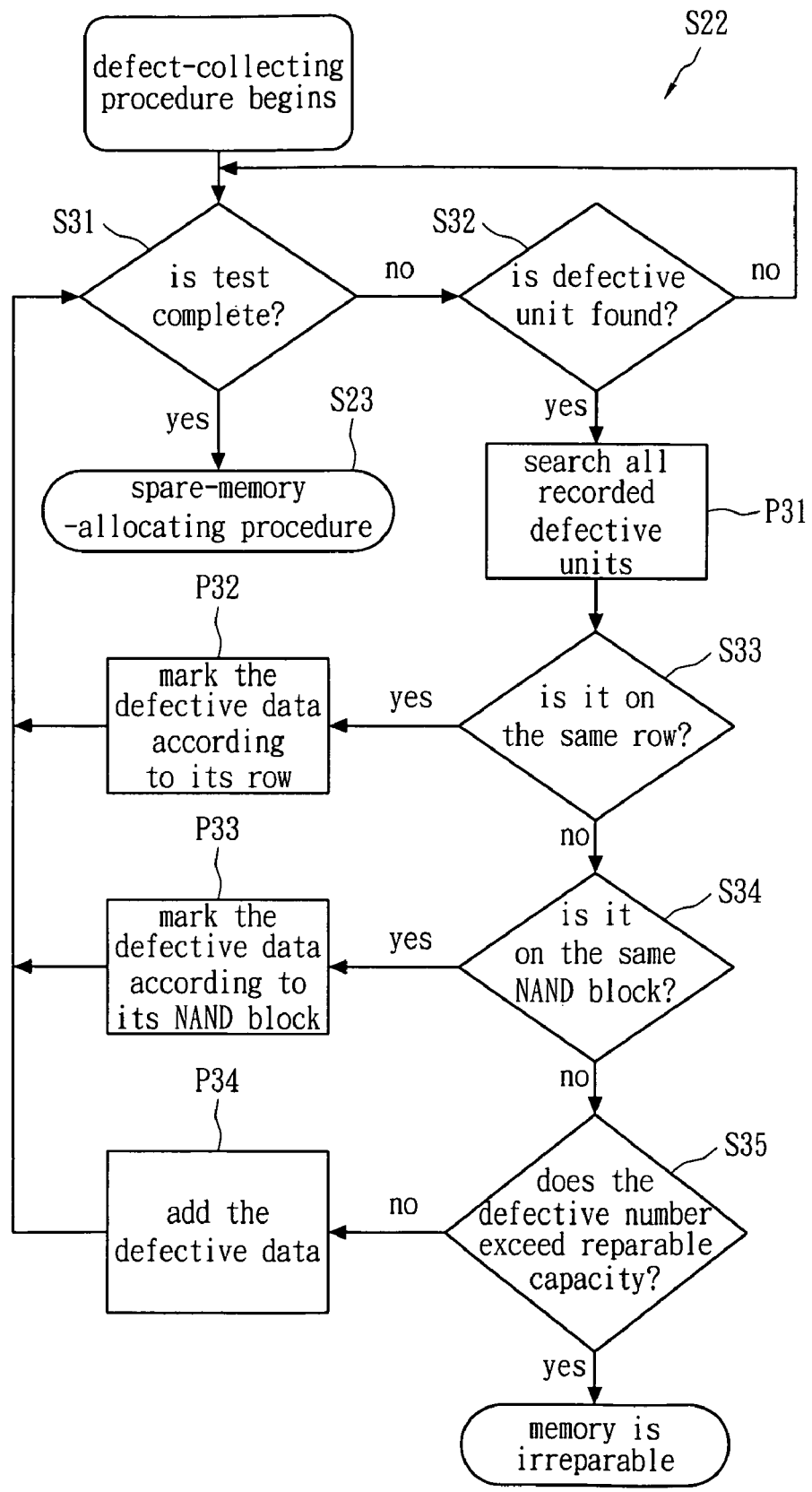
FIG. 3 shows a flow chart of the defect-collecting procedure.

FIG. 3 shows a flow chart of the defect-collecting procedure S22. After the BIST circuit 12 starts to test, The BIRA circuit 11 enters the defect-collecting procedure. In step S31, it is examined first whether the test is completed. If not yet completed, it is examined whether the BIST circuit 12 has ever provided defective information to the BIRA circuit 11, as shown in step S32. If the answer of step S32 is negative, then step S31 is performed. Otherwise, the BIRA circuit 11 compares with the defective data stored in the CAM 16, as shown in step P31. In step S33, it is examined whether the current defective data has the same column address as the contents in the CAM 16. If the answer of step S33 is positive, then step P32 is performed, making a mark at that column, and step S31 is performed. Otherwise, it is continuously examined whether the current defective data has the same NAND block address as the defective data in CAM 16, as shown in step S34. If the answer of step S34 is affirmative, then step P33 is performed, the NAND block address is marked, and step S31 is repeatedly performed. If the answer of step S34 is negative, it is examined whether the increasing number of defective data records exceeds a reparable upper limit, as shown in step S35. If the answer in step 35 is affirmative, it means that the memory is irreparable, and the present invention stops the repair process. If the answer of step S35 is negative, it means this defective data is newly found and it is necessary to record its column and NOR block address, as shown in step P34. If the answer of step S31 is affirmative, it means this test is completed and step S23 is performed again.

The maximally reparable number of data records in a NOR flash memory relies on the size of the spare memory and the number of words in the CAM 16. Generally, the minimum of the above factors is the maximally reparable number of data records in the reparable NAND flash memory.

Figure 4:
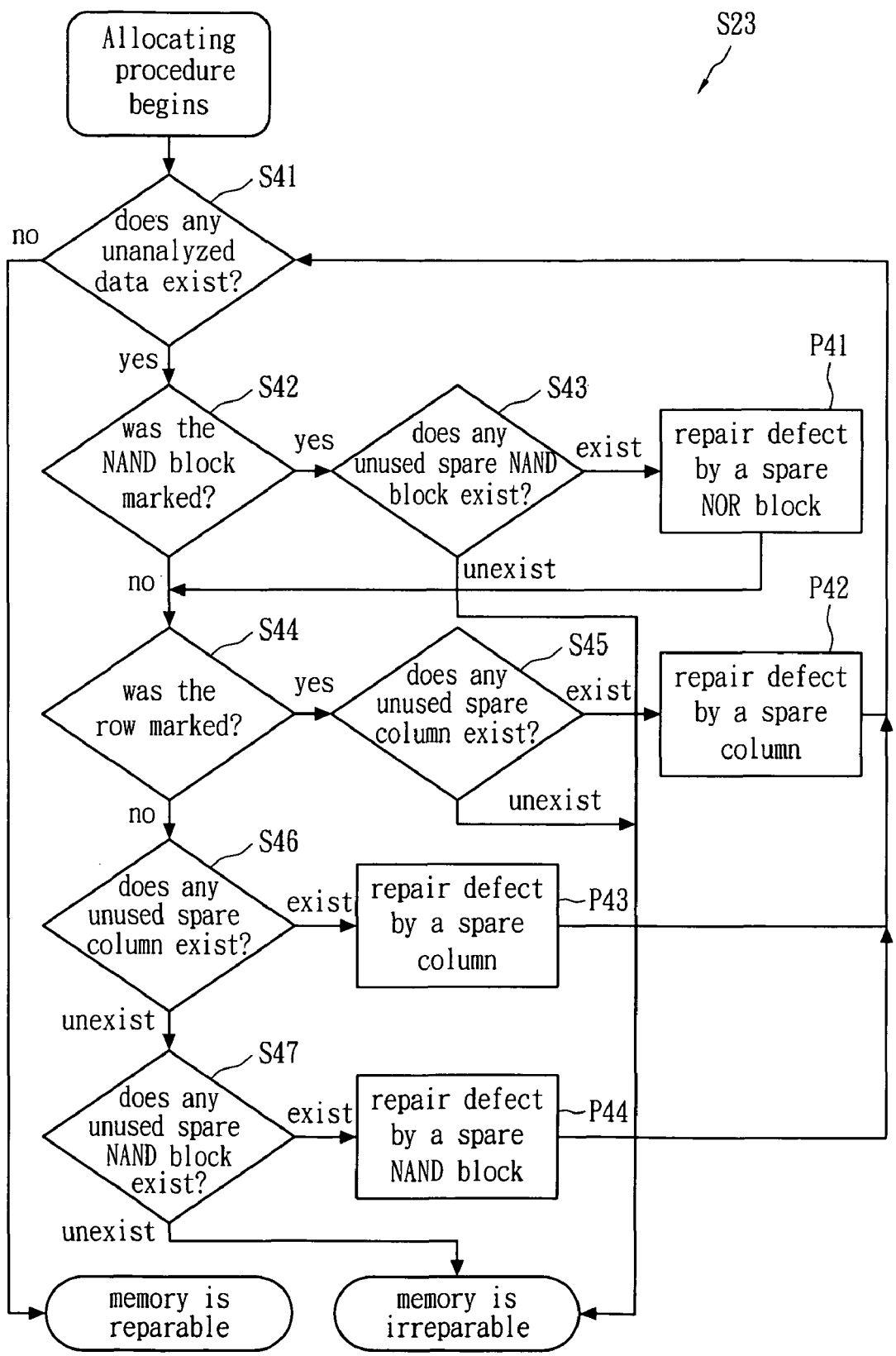
FIG. 4 shows a flow chart of an allocation procedure of the spare memory in accordance with one embodiment of the present invention.

FIG. 4 shows a flow chart of an allocation procedure of the spare memory in accordance with one embodiment of the present invention. After the test is completed, the spare memory allocating procedure is entered. In step S41, it is examined first whether any unanalyzed data remains in the procedure. If the answer is negative, then the self-repair procedure is completed, which means the memory has been repaired. If the answer of step S41 is affirmative, then the BIRA circuit 11 sequentially compares the defective data stored in the CAM 16 in an item-by-item manner. In step S42, it is examined first whether any NAND block address of the defective data is marked. If the answer of step S42 is affirmative, it is further examined whether there is any spare NAND block available in the spare memory, as shown in step S43. If the answer of step S43 is affirmative, a spare NAND block is used to repair the NAND block corresponding to the defective data, as shown in step P41. If the answer of step S43 is negative, it means that the memory under test and repair is irreparable and thus the self-repair method of the present invention stops the subsequent repair procedure. If the answer of step S42 is negative, step S44 is performed, which examines whether the column address is marked. If the answer of step S44 is affirmative, step S45 is performed, which examines whether there is any spare column available in the spare memory. If affirmative, a spare column is used to repair the defective column corresponding to the defective data, as shown in step P42. If the answer of step S45 is negative, this means the memory under test and repair is irreparable and thus the present invention stops subsequent repair procedure. If the answer of step S44 is negative, step S46 is performed, which examines whether there is any corresponding spare column available in the spare memory. If affirmative, a spare column is used to repair a defective column corresponding to the defective data, as shown in step P43. If the answer of step S46 is negative, it is examined whether there is any spare NAND block available in the corresponding spare memory, as shown in step S47. If the answer of step S47 is affirmative, a spare NAND block is used to repair the defective NAND block corresponding to the defective data, as shown in step P44. If the answer of step S47 is negative, this means it is irreparable, and thus the present invention stops the reparable procedure. After all defective data stored in the CAM 16 is checked, the self-repair procedure ends. The repaired data is stored in CAM 16, which provides corresponding addresses of the spare memory while the NAND flash accesses the defective data.

FIG. 5 shows a format of defective data stored in the CAM 16 after the self-repair procedure ends. The first item on the left represents the category of the memory unit corresponding to the defective data. The second item represents an identification code of the corresponding memory unit, which indicates the position of the corresponding memory unit. The third item represents the NAND block address of the defective unit. The fifth item represents the column address of the defective unit. The sixth item represents the bit address of the defective unit. The seventh item indicates validity of the defective data. Because the spare NAND block replaces a defective NAND block, the format of the spare NAND block does not need a column address and bit address. Likewise, because the spare column can repair a defective bit and be used to cross the border of NAND blocks, it is necessary to obtain a column address and bit address rather than NAND block address.

Figure 6:
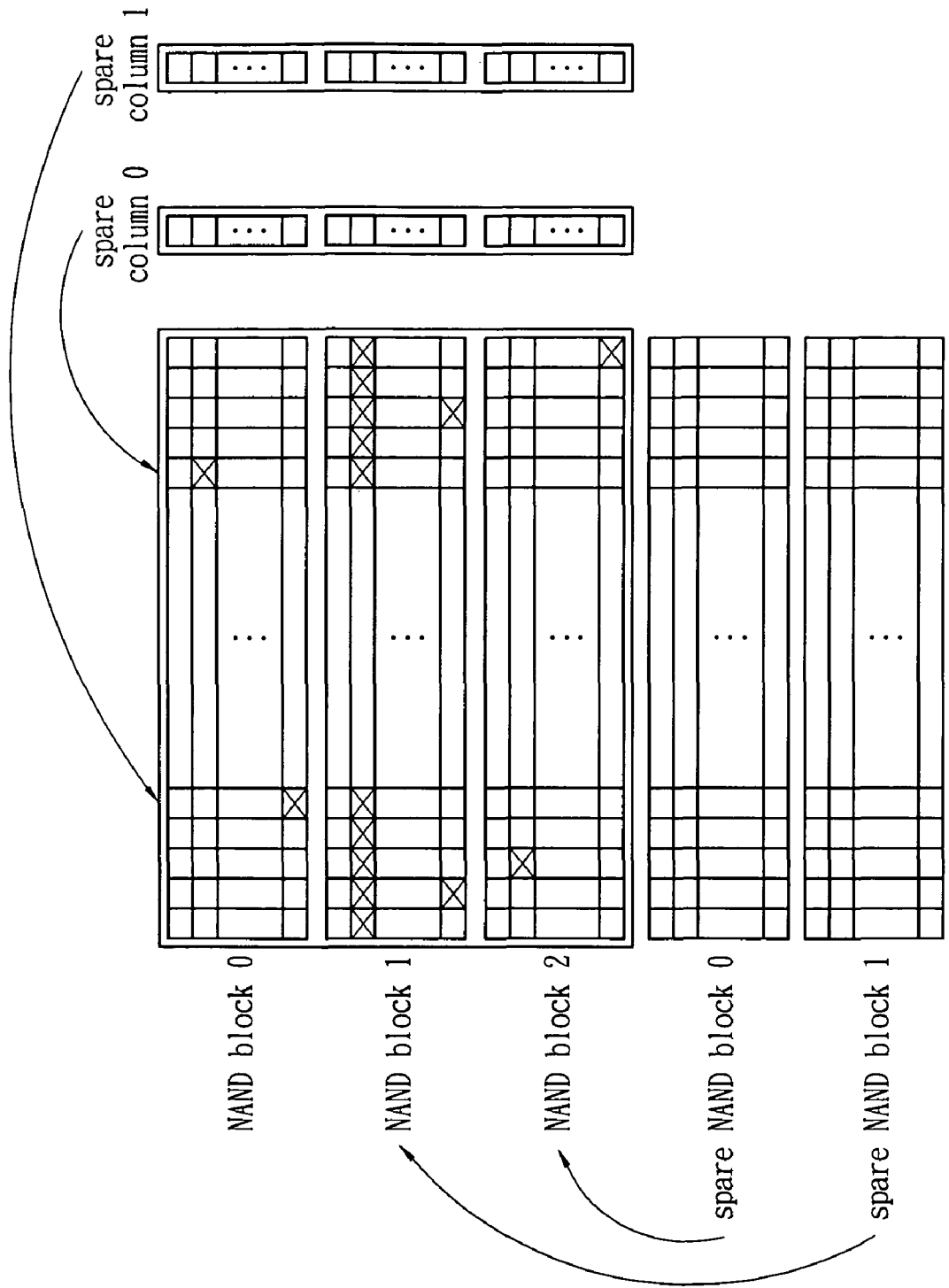
FIG. 6 shows a hint diagram of a spare memory structure of a built-in self-repair system in accordance with one embodiment of the present invention.

FIG. 6 shows a hint diagram of a spare memory structure of a built-in self-repair system in accordance with one embodiment of the present invention, which shows a block of a NAND flash memory and its corresponding spare memory. The system of the present invention performs self-repair upon NAND blocks. If the main memory has two single defects on NAND block 0, two single defects and a page defect on NAND block 1, two single defects on NAND block 2, then in accordance with the present embodiment a spare NAND block 0 is used to replace the NAND block 2, a spare NAND block 1 is used to replace the NAND block 1, a spare column o is used to replace the column on which the single defect of the NAND block is located, and a spare column 1 is used to replace the column on which another single defect of the NAND block is located.

The present invention provides a built-in self-repair system applied to a NAND flash memory, which is simple, possesses fewer additional registers, occupies a smaller area and features highly-efficient repair performance. In addition, the present invention is capable of conducting a synchronous repair during read and write operations of the NAND flash memory.

The above-described embodiments of the present invention are intended to be illustrative only. Numerous alternative embodiments may be devised by person skilled in the art without departing from the scope of the following claims.

What is claimed is:

1. A built-in self-test system applied to NAND flash memories, comprising:
    a built-in self-test circuit configured to test defective data in a NAND flash memory;
    a built-in redundancy-analysis circuit connected to the built-in self-test circuit;
    a content addressable memory connected to the built-in redundancy-analysis circuit for storing the address of the defective data;
    a spare memory electrically connected to the content addressable memory;
    a page-mode processor configured to generate a page address signal and a compensation signal according to an address signal of the NAND flash memory; and
    an address generator configured to generate a current address signal according to the page address signal and compensation signal to the content addressable memory.

2. The built-in self-test system of claim 1, further comprising a test switcher, wherein the test switcher is connected to the built-in self-test circuit and address generator for switching between a test mode and a normal mode.

3. The built-in self-test system of claim 1, wherein the spare memory includes spare columns and spare NAND blocks.

4. The built-in self-test system of claim 1, wherein the content addressable memory outputs a hit signal if the current address signal is equal to a content of the content addressable memory.

5. A built-in self-test method applied to NAND flash memories, comprising the steps of:
    testing a NAND flash memory;
    marking a defective column if more than one defective data record is found in the defective column;
    marking a defective NAND block if more than one defective data record is found in the defective NAND block;
    repairing the defective column with a spare column; and
    repairing the defective NAND block with a spare NAND block.

6. The built-in self-test method of claim 5, further comprising the steps of:
    repairing the defective data with a spare column if there is no marked defective column nor defective NAND block remaining and there is an available spare column remaining; and
    repairing the defective data with a spare NAND block if there is no marked defective column, marked defective NAND block nor spare column remaining but there is an available spare NAND block remaining.

7. The built-in self-test method of claim 5, further comprising the step of exhibiting an irreparable message if there is no available spare column nor spare NAND block.

8. The built-in self-test method of claim 5, further comprising the step of storing the NAND block address and column address of the defective data in a content addressable memory.

9. The built-in self-test method of claim 8, further comprising the step of exhibiting an irreparable message if there is no room in the content addressable memory.

10. The built-in self-test method of claim 8, wherein the format stored in the content addressable memory includes categories of the spare memories, identification code of the spare memory, NAND block address of the defective data and column address of the defective data.

11. The built-in self-test method of claim 10, wherein the format stored in the content addressable memory further includes bit address and validity of the defective data.

12. A built-in self-test method applied to NAND flash memories, comprising the steps of:
    testing a NAND flash memory;
    collecting defective data after the test;
    repairing the defective data with spare columns;
    repairing the defective data with spare NAND blocks; and
    storing the NAND block address and column address of the defective data in a content addressable memory.

13. The built-in self-test method of claim 12, wherein the spare NAND block is used to repair if more than one defective data record is found in a NAND block.

14. The built-in self-test method of claim 12, wherein the spare column is used to repair if more than one defective data record is not found in a NAND block but is found in a column.

15. The built-in self-test method of claim 12, wherein the spare column is used to repair if more than one defective data record is not found in either a NAND block or a column.

16. The built-in self-test method of claim 12, further comprising the step of exhibiting an irreparable message if there is no available spare column or spare NAND block.

17. The built-in self-test method of Claim 12, further comprising the step of exhibiting an irreparable message if there is no room in the content addressable memory.

18. The built-in self-test method of claim 12, wherein the format stored in the content addressable memory includes categories of the spare memories, identification code of the spare memory, NAND block address of the defective data and column address of the defective data.

19. The built-in self-test method of claim 18, wherein the format stored in the content addressable memory further includes bit address and validity of the defective data.

* * * * *